(12) United States Patent
Lin et al.

(10) Patent No.: US 8,432,032 B2
(45) Date of Patent: Apr. 30, 2013

(54) CHIP PACKAGE AND FABRICATION METHOD THEREOF

(76) Inventors: Chia-Sheng Lin, Zhongli (TW);
Chia-Lun Tsai, Tainan (TW);
Chang-Sheng Hsu, Hsinchu (TW);
Po-Han Lee, Taipei (TW)

( * ) Notice: Subject to any disclaimer, the term of this patent is extended or adjusted under 35 U.S.C. 154(b) by 482 days.

(21) Appl. No.: 12/687,093

(22) Filed: Jan. 13, 2010

(65) Prior Publication Data
US 2011/0169139 A1    Jul. 14, 2011

(51) Int. Cl.
*H01L 23/48*    (2006.01)
(52) U.S. Cl.
USPC .............. 257/692; 257/621; 257/E21.499; 257/E23.011; 438/460; 438/667
(58) Field of Classification Search ............ 438/106, 438/110, 113, 114, 460, 667; 257/621, 692, 257/257/758, 774, E21.575, E21.499, E21.599, 257/E23.011
See application file for complete search history.

(56) References Cited

U.S. PATENT DOCUMENTS 7,662,670 B2 *   2/2010   Noma et al. .................. 438/114

* cited by examiner

*Primary Examiner* — David Vu
(74) *Attorney, Agent, or Firm* — Liu & Liu

(57) ABSTRACT

A chip package and a fabrication method thereof are provided. The chip package includes a semiconductor substrate, having a first surface and an opposite second surface. A through hole is formed on the first surface, extending from the first surface to the second surface. A conductive trace layer is formed on the first surface and in the through hole. A buffer plug is formed in the through hole and a protection layer is formed over the first surface and in the through hole.

24 Claims, 5 Drawing Sheets

CHIP PACKAGE AND FABRICATION METHOD THEREOF

BACKGROUND OF THE INVENTION

1. Field of the Invention

The present invention relates to a chip package, and in particular relates to a chip package with a through-silicon via and a fabrication method thereof.

2. Description of the Related Art

To enable electronic equipment to become smaller, chip packages contained therein have been becoming smaller. One approach for reducing the size of chip packages includes using through-silicon vias in the packaged chips. However, in some situations, a redistribution layer in the through-silicon vias is easily delaminated from the sidewall of the vias during a thermal cycle test. Accordingly, the through-silicon vias also reduce the reliability of the packaged chips.

Thus, a new chip package design and a fabrication method thereof are thus desired.

BRIEF SUMMARY OF THE INVENTION

According to an illustrative embodiment, a chip package is provided. The chip package comprises a semiconductor substrate, having a first surface and an opposite second surface. A through hole is disposed on the first surface, extending from the first surface to the second surface. A conductive trace layer is disposed over the first surface and extends to the through hole. Then, a buffer plug is disposed over the conductive trace layer in the through hole and a protection layer is disposed to cover the entire first surface of the semiconductor substrate.

According to another illustrative embodiment, a method for fabricating a chip package is provided. The method comprises providing a semiconductor substrate, having a first surface and an opposite second surface. Through holes are formed on the first surface, extending from the first surface to the second surface. A conductive trace layer is conformally formed over the first surface and extends to the through holes. Then, a buffer plug is formed over the conductive trace layer in the through holes and a protection layer is formed to cover the entire first surface of the semiconductor substrate.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The embodiments of chip packages of the invention and fabrication methods thereof are illustrated by embodiments of fabricating image sensor chip packages in the following description. However, it should be appreciated that the invention may also be applied to forming other semiconductor chips. Therefore, the packages of the embodiments of the invention may be applied to active or passive devices, or electronic components with digital or analog circuits, such as opto electronic devices, micro electro mechanical systems (MEMS), micro fluidic systems, and physical sensors for detecting heat, light, or pressure. Particularly, a wafer scale package (WSP) process may be applied to package semiconductor chips, such as image sensor devices, solar cells, RF circuits, accelerators, gyroscopes, micro actuators, surface acoustic wave devices, pressure sensors, and ink printer heads.

The wafer scale package process mentioned above mainly means that after the package process is accomplished during the wafer stage, the wafer with chips is cut to obtain separate independent packages. However, in an embodiment of the invention, separate independent chips may be redistributed overlying a supporting wafer and then be packaged, which may also be referred to as a wafer level chip scale package (WLCSP) process. In addition, the above mentioned wafer scale package process may also be adapted to form chip packages of multi-layered integrated circuit devices by stacking a plurality of wafers having integrated circuits.

Figure 1:
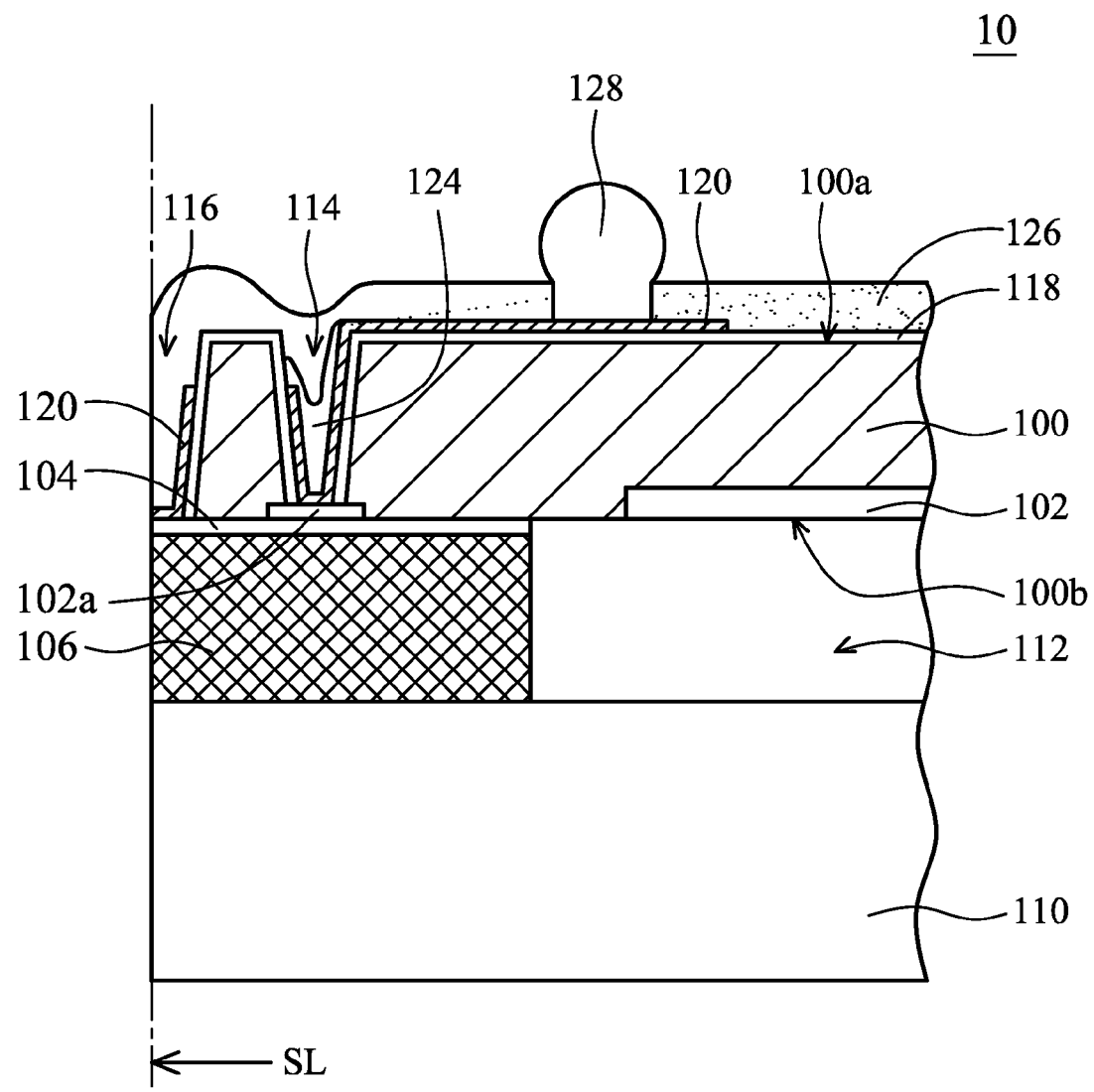
FIG. 1 shows an illustrative cross section of a chip package according to an embodiment of the invention.

Referring to FIG. 1, a cross section of a portion of a chip package according to an embodiment of the invention is shown, which can be fabricated by a wafer scale package process. First, a chip 10 with a semiconductor substrate 100 is provided. The semiconductor substrate 100 has a first surface 100a and an opposite second surface 100b. A semiconductor device 102, such as CMOS image sensor and/or micro lens, is formed on the second surface 100b serving as an active surface. At least a through hole 114 is formed on the first surface 100a, extending from the first surface 100a toward the second surface 100b. At least a conductive pad 102a is exposed by the through hole 114, which is electrically connected to the semiconductor device 102, for example, through an interconnection. In another embodiment, at least a recess portion 116 may be further formed adjacent a sidewall of the semiconductor substrate 100, extending from the first surface 100a toward the second surface 100b, wherein the recess portion 116 is formed by cutting a trench opening at a scribe line SL. The scribe line SL is disposed between any two adjacent chips.

A patterned insulating layer 118 is formed on the first surface 100a and extends to the sidewalls of the through hole 114 and the recess portion 116. In another embodiment, the portions of the insulating layer 118 on the bottom sides of the through holes 114 are removed. Examples of materials for forming insulating layer 118 include, but are not limited to an inorganic material such as silicon dioxide or a photosensitive insulating material such as an insulating photo-resist. A patterned conductive trace layer 120 is then conformally formed on the insulating layer 118 over the first surface 100a and extends to the through holes 114. In an embodiment, the conductive trace layer 120 can be a redistribution layer. The conductive trace layer 120 may be a metal layer made of material such as a copper, aluminum, silver, or nickel layer or alloys thereof. In another embodiment, the patterned conductive trace layer 120 may be further conformally formed within the recess portion 116, wherein a gap for isolation is formed between the conductive trace layer 120 in the through hole 114 and the recess portion 116.

Note that a buffer plug 124 is formed in the through hole 114 and then a protection layer 126 is formed to cover the first surface 100a and fill the through hole 114 and the recess portion 116. In the through hole 114, the filled buffer plug 124 is used to separate the conductive trace layer 120 and the later filled protection layer 126. In the recess portion 116, the conductive trace layer 120 is used to separate the protection layer 126 and the later formed spacer 106. In the embodiments of the invention, the buffer plug 124 may be formed of one or more than one layers of softer materials. The protection layer 126 may be a harder material, such as solder mask.

In one embodiment, to enhance the reliability of the chip package, the material of the buffer plug 124 is not completely cured, such that the adhesion between the buffer plug 124 and the protection layer 126 within the through hole 114 is reduced. For example, a curable buffer plug 124 may be cured under its Glass Transition Temperature (Tg) or for a shorter time, to thereby obtain a soft cured product with poor adhesion. A curing method is arbitrary, and a method of curing by heat, light, electron beam, or the like may be employed. When a thermal cycle test is performed to the chip package, the protection layer 126, a harder material, may shrink and a pull up force is then produced from the protection layer 126. However, the soft buffer plug 124 can be deformed to offset the pull up force from the protection layer 126 and prevent the conductive trace layer 120 from delaminating. That is, most of the buffer plugs 124 in through holes 114 in shape or size are different after the above mentioned curing process.

Alternatively. to offset the great difference between the coefficient of thermal expansion (CTE) of the protection layer 126 and that of the insulating layer 118, according to an embodiment of the invention, the buffer plug 124 has a CTE between a CTE of the protection layer 126 and a CTE of the insulating layer 118, such that the difference between the CTEs of the protection layer 126 and the insulating layer 118 can be adjusted by the buffer plug 124 to prevent the chip package from delaminating during the thermal cycle test. In one embodiment, the protection layer 126 may have a CTE of about 159 ppm/° C. and the insulating layer 118 may have a CTE of about 54 ppm/° C. Accordingly, the buffer plug 124 may have a CTE between 159 ppm/° C. and 54 ppm/° C. Moreover, in one example, the buffer plug 124 may be formed of more than one layers of photo-resist with more than one kind of material. Accordingly, the buffer plug 124 may have CTEs which gradually changed from 54 ppm/° C. to 159 ppm/° C.

Referring again to FIG. 1, a cover plate 110 may be attached under the second surface 100b of the semiconductor substrate 100. The cover plate 110 or the cover plate may be a transparent substrate or a semiconductor substrate. In an embodiment of the invention, a spacer 106 can be disposed between the cover plate 110 and the semiconductor substrate 100 to form a cavity 112 between the cover plate 110 and the semiconductor device 102, wherein the cavity 112 is surrounded by the spacer 106. In another embodiment, the spacer 106 can fill up the space between the cover plate 110 and the semiconductor substrate 100 and no cavity would be produced. The spacer 106 may be formed from epoxy resin, solder mask or any other suitable supporting materials. In addition, an adhesive layer 104 can be used to attach the spacer 106 and the semiconductor substrate 100, while the spacer 106 is formed on the cover plate 110. Alternatively, the adhesive layer can be added between the spacer 106 and the cover plate 110, while the spacer 106 is formed on the semiconductor substrate 100. The adhesive layer may be a polymer film, or one or more than one of an adhesive such as an epoxy or polyurethane adhesive.

A conductive bump 128 is disposed in an opening of the protection layer 126 on the first surface 100a to electrically connect with the conductive trace layer 120. The conductive bump 128 may be a solder ball or a solder paste.

The conductive trace layer 120 formed in the recess portion 116 has several advantages. First, as shown in FIG. 1, the conductive trace layer 120 in the recess portion 116 is extended to the scribe line SL and covers the sidewall of the semiconductor substrate 100, such that it can prevent the chip package from being permeated by moisture. Second, the spacer 106 may be formed from the same material of the protection layer 126 such as a solder mask. Meanwhile, if the protection layer is connected with the spacer, the stress produced in the protection layer and the spacer is great. However, according to an embodiment of the invention, the protection layer 126 is separated from the spacer 106 by the conductive trace layer 120 and the adhesive layer 104, such that the stress produced in the protection layer 126 and the spacer 106 is reduced.

Figure 2A:
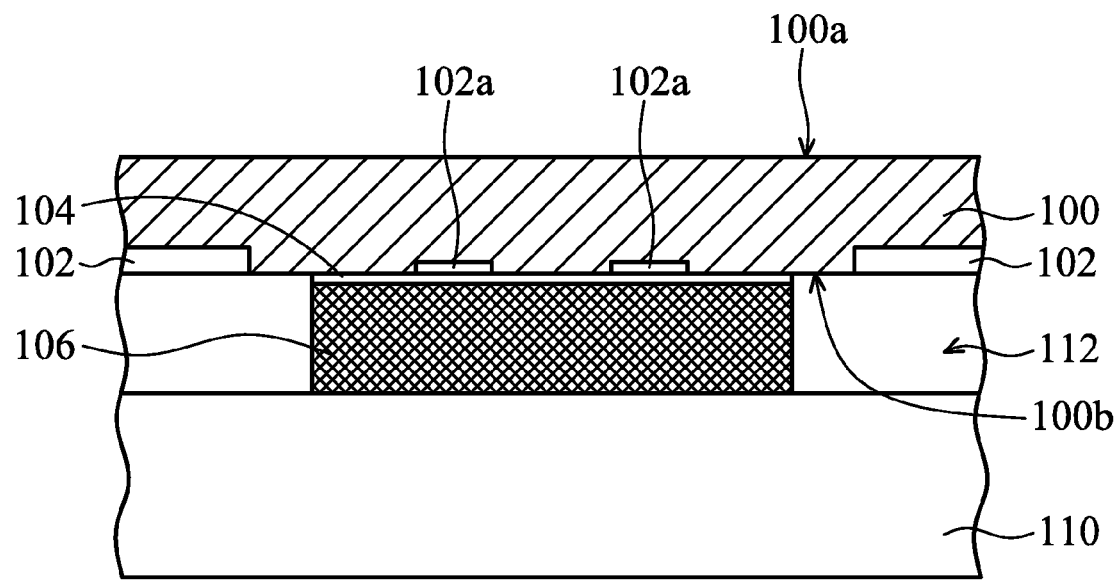
FIGS. 2A-2H are illustrative cross sections showing the steps for fabricating a chip package according to an embodiment of the invention.

FIGS. 2A-2H show cross sections of parts of the steps for fabricating a chip package according to an embodiment of the invention. Referring to FIG. 2A, during a foundry stage, a semiconductor substrate 100 such as a wafer with chips is provided first, having a first surface 100a and an opposite second surface 100b. A plurality of semiconductor devices 102 is formed on the second surface 100b. A plurality of conductive pads 102a is formed on the second surface 100b to electrically connect with each semiconductor device 102.

Next, a packaging stage is performed. In one embodiment, the second surface 100b of the wafer 100 is attached to a cover plate 110 serving as a carrier. The cover plate 110 may be formed from glass, quartz, opal, plastic, or other transparent substrates to provide light emission in and out thereto and therefrom. Note that a filter and/or an anti-reflective layer may be selectively formed on the cover plate 110. In one example, a spacer 106 may be formed on the cover plate 110 or the wafer 100 and then attach one to another, such that a cavity 112 is formed between the cover plate 110 and the wafer 100, as shown in FIG. 2A. The cavity 112 is surrounded by the spacer 106, and the material of the spacer 106 may be epoxy resin, solder mask or any other suitable supporting materials, such as an inorganic material or an organic material of polyimide (PI). In order to increase the hermetic seal of the package, an adhesive layer 104 may be added between the spacer 106 and the wafer 100, while the spacer 106 is formed on the cover plate 110. Alternatively, the adhesive layer can be added between the spacer 106 and the cover plate 110, while the spacer 106 is formed on the semiconductor substrate 100. Next, a step of thinning the wafer 100 at the first surface 100a can be selectively performed. The thinning process may be an etching, milling, grinding or polishing process.

Figure 2B:
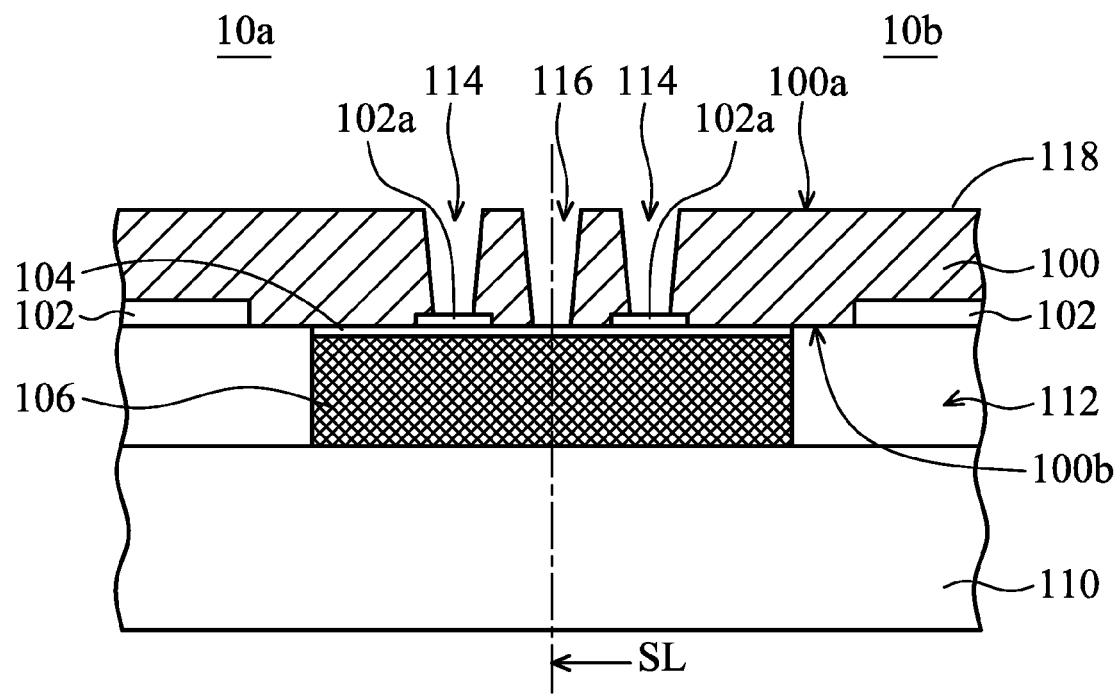

Referring to FIG. 2B, a plurality of through holes 114 and/or trench openings 116 are formed in the wafer 100, extending along a direction form the first surface 100a to the second surface 100b by a removing process such as drilling or etching. The conductive pads 102a are exposed by the through holes 114. Each trench opening 116 is formed at the scribe line SL between two adjacent chips 10a and 10b In an embodiment, the through holes 114 and the trench openings 116 can be formed simultaneously by the same etching process. Alternatively, the trench openings 116 may be notches at the scribe line SL formed by a pre-cutting process from a cutter.

Figure 2C:
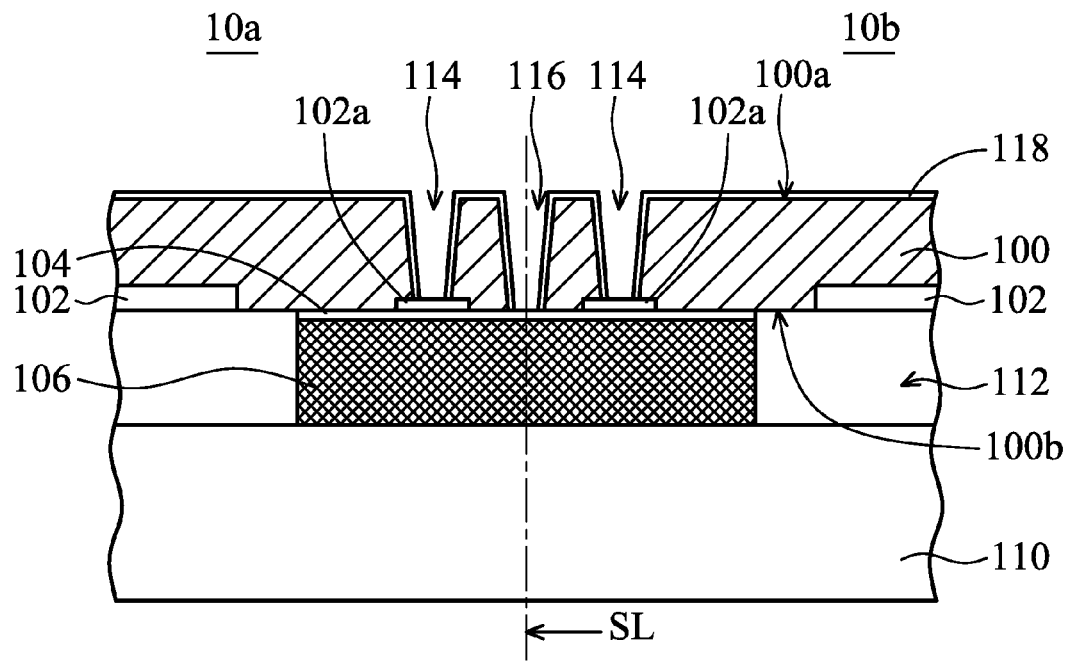

Then, referring to FIG. 2C, in order to isolate the semiconductor substrate 100 and subsequently form conductive trace layers, an insulating material can be conformally formed to cover the first surface 100a of the semiconductor substrate 100 and extend to sidewalls and bottom sides of the through holes 114 and the trench openings 116. Then, the insulating material can be patterned to remove the portions of the insulating material at the bottom sides of the through holes 114 and the bottom sides of the trench openings 116 to form the patterned insulating layer 118. The conductive pads 102a at the bottom sides of the through holes 114 are also exposed by the patterned insulating layer 118. In one embodiment, the insulating layer 118 may be formed from a photosensitive insulating material. In this embodiment, the photosensitive insulating material can be selected from photosensitive organic polymer materials. The compositions of the photosensitive organic polymer materials may include, but is not limited to, a polyimide (PI), butylcyclobutene (BCB), parylene, polynaphthalenes, fluorocarbons, and accrylates material etc. The photosensitive organic polymer materials can be formed by a coating process, such as a spin coating, a spray coating, or a curtain coating process, or other suitable deposition methods.

Figure 2D:
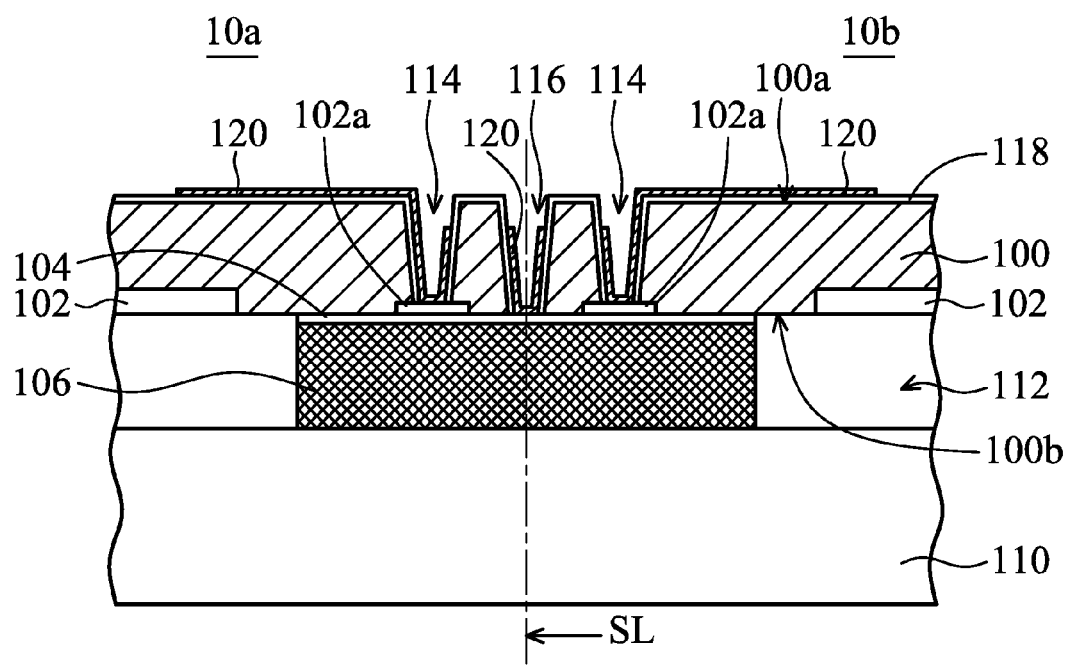

Referring to FIG. 2D, a conductive material is formed on the entire insulating layer 118. The conductive material is conformally formed over the first surfaces 100a of the wafer 100 and extended to the sidewalls and the bottom sides of the through holes 114 and the trench openings 116. In one embodiment, the conductive material may be a copper, aluminum, silver, or nickel layer or alloys thereof, which can be conformally deposited by a physical vapor deposition (PVD) or a sputtering process. Then, the conductive material is patterned by a photolithography and etching process to form the conductive trace layer 120. The conductive trace layer 120 is extended from the first surface 100a of the wafer 100 to the sidewalls and the bottom sides of the through holes 114 to electrically connect with the conductive pads at the bottom sides of the through holes 114. The conductive trace layer 120 may be also formed on the sidewalls and the bottom sides of the trench openings 116, but a gap for isolation is formed between the conductive trace layer 120 in the through holes 114 and in the trench openings 116 and thus they are not continuous.

Figure 2E:
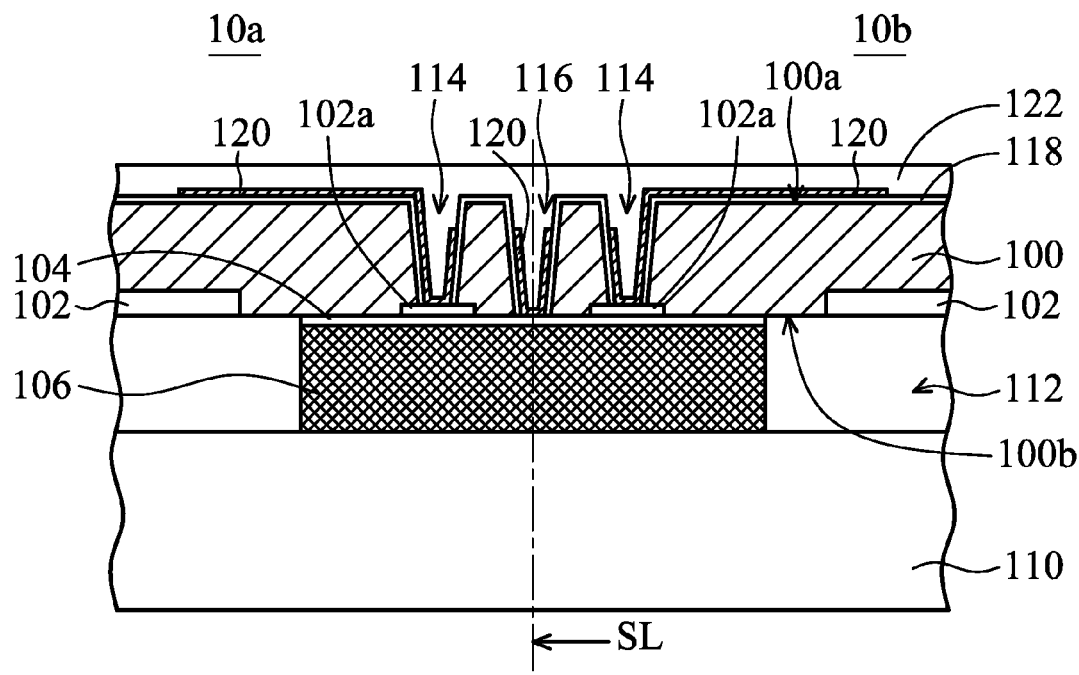
Figure 2F:
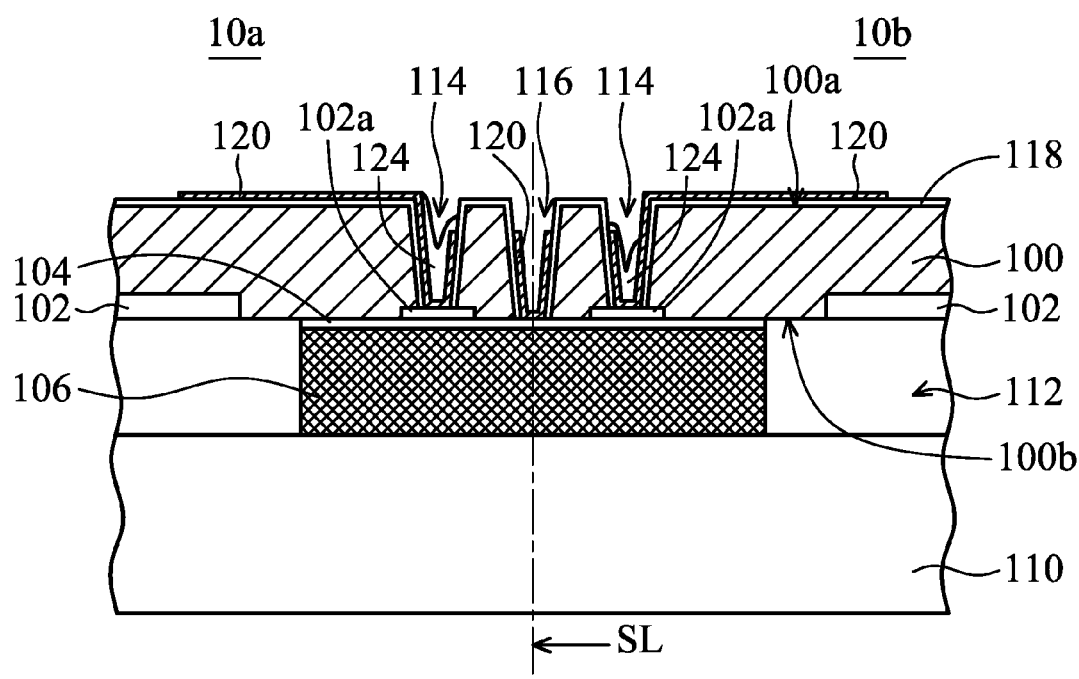

Referring to FIG. 2E, a buffer material 122 is then formed to cover the entire first surface 100a of the wafer 100 and fill the through holes 114 and the trench openings 116 by a coating process, such as a spin coating, a spray coating, or a curtain coating process. In an embodiment, the buffer material 122 may be a photosensitive material such as an epoxy based photo resist without fillers. Then, referring to FIG. 2F, the buffer material 122 is patterned by an exposure and a development process to leave a portion of the buffer material 122 in the through holes 114 to form a buffer plug 124. The buffer plug 124 may be a plug in each through hole 114. Then, the buffer plug 124 in the through holes 114 is cured, but not completely, to reduce the adhesion between the buffer plug 124 and subsequently formed protection layer. Therefore, the buffer plug 124 can resist a pull up force from the protection layer during the thermal cycle test and prevent the conductive trace layer 120 in the through holes 114 from delaminating. In addition, because the buffer plug 124 is not completely cured, the buffer plug 124 formed in at least two of the through holes 114 have different shapes at a cross section, for example, one buffer plug 124 in a through hole 114 is different from the other buffer plug 124 in another through hole 114. Moreover, the buffer plug 124 may be formed of one or more than one layers of photosensitive materials.

Figure 2G:
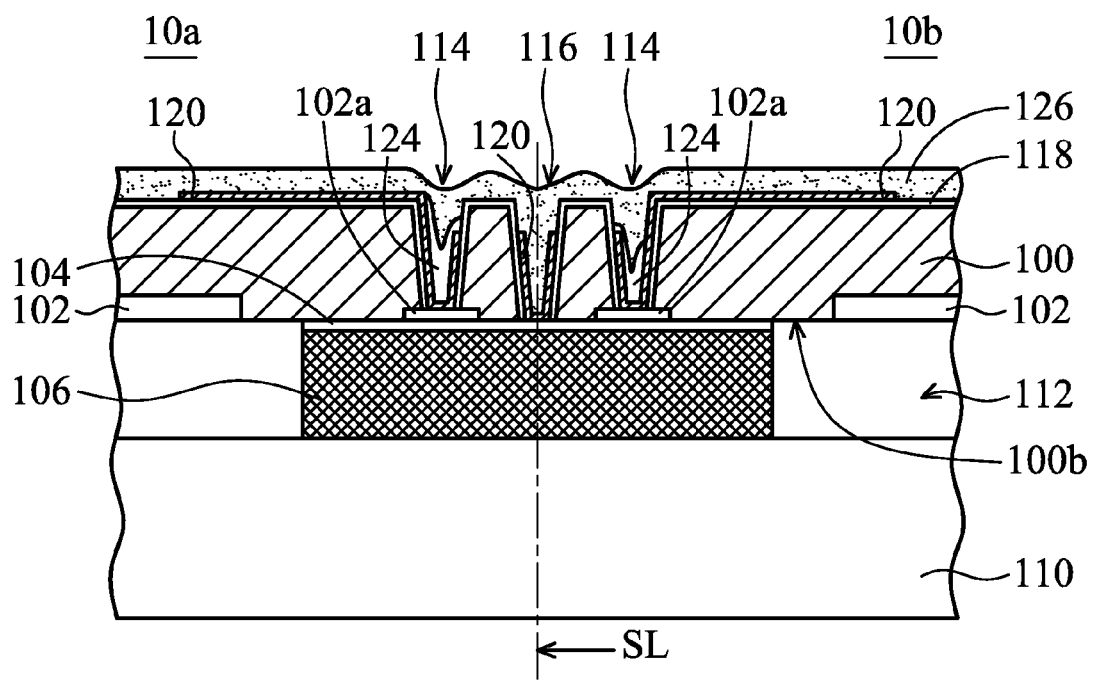

Referring to FIG. 2G, a protection layer 126 is formed on the conductive trace layer 120, covering the first surface 100a of the wafer 100 and filling the through holes 114 and the trench openings 116. The protection layer 126 may be a solder mask with fillers such as silicon carbide, silicon oxide, or aluminum oxide. Note that the buffer plug 124 has a CTE between a CTE of the protection layer 126 and a CTE of the insulating layer 118 or the conductive trace layer 120, such that the difference between the CTEs of the protection layer 126 and the insulating layer 118 or the conductive trace layer 120 can be adjusted by the buffer plug 124 to prevent the chip package from delaminating during the thermal cycle test. In one embodiment, the protection layer 126 may have a CTE of about 159 ppm/° C. and the insulating layer 118 may have a CTE of about 54 ppm/° C. Accordingly, the buffer plug 124 may have a CTE between 159 ppm/° C. and 54 ppm/° C.

Figure 2H:
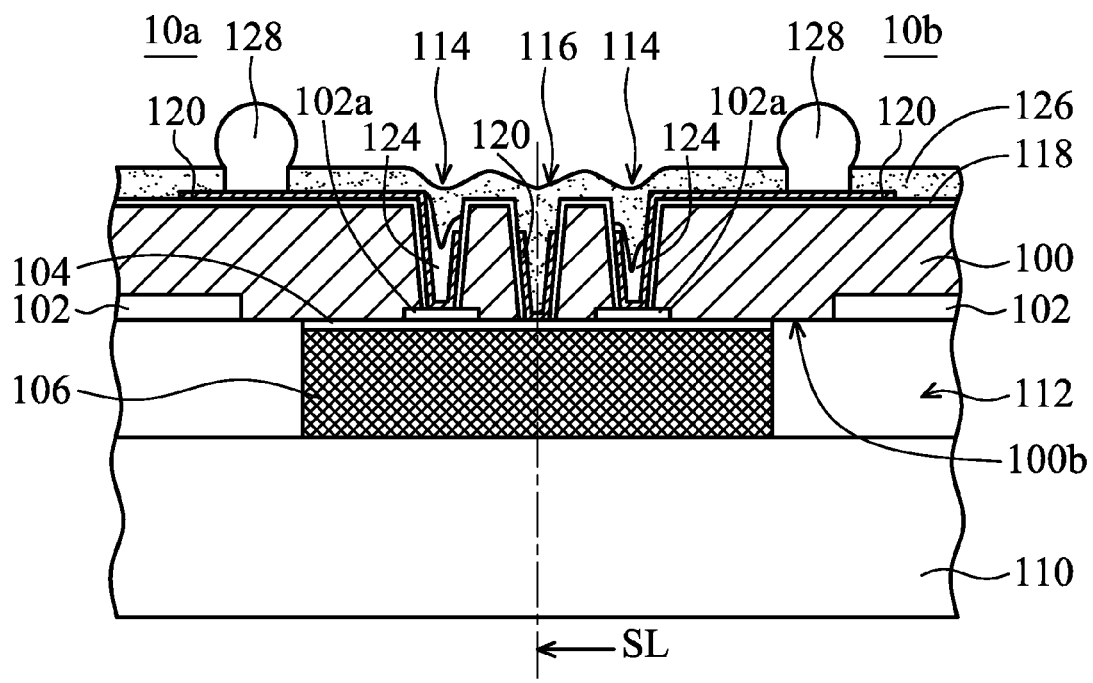

Then, referring to FIG. 2H, a conductive bump 128 is formed through the protection layer 126 to electrically connect to the conductive trace layer 120. In an embodiment, after forming the protection layer 126, an opening to expose a portion of the conductive trace layer 120 can be formed by patterning the protection layer 126. Next, a solder is filled into the above mentioned opening by an electroplating or a screen printing method. A re-flow process is performed to form the conductive bump 128 such as a solder ball or a solder paste. Then, the above mentioned wafer scale package is diced along the scribe line SL to separate each chip to form a plurality of the chip packages of FIG. 1.

According to an embodiment of the invention, the trench openings 116 at the scribe line SL is formed by the etching process, such that there is no micro-crack produced in the sidewalls of the semiconductor substrate 100. In addition, after the dicing process, the recess portion 116 is thus formed and the conductive trace layer 120 in the recess portion 116 is extended to the scribe line SL and covers the sidewalls of the semiconductor substrate 100. Accordingly, the conductive trace layer 120 can effectively prevent the chip package from being permeated by moisture.

Moreover, in an embodiment of the invention, there is no buffer plug in the recess portion 116, such that the adhesion of the protection layer 126 in the recess portion 116 is better than that in the through hole 114 to avoid the delamination of the protection layer 126 in the recess portion 116.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
 a semiconductor substrate, having a first surface and an opposite second surface;
 a through hole disposed on the first surface, extending from the first surface to the second surface;
 a conductive trace layer conformally disposed over the first surface and in the through hole;
 a buffer plug disposed in the through hole over the conductive trace layer, wherein the buffer plug does not extend to cover above the first surface of the semiconductor substrate outside of the through hole; and
 a protection layer disposed over the first surface and in the through hole.

2. The chip package as claimed in claim 1, wherein the buffer plug is disposed between the conductive trace layer and the protection layer in the through hole.

3. The chip package as claimed in claim 1, further comprising a recess portion adjacent a sidewall of the semiconductor substrate, extending from the first surface to the second surface, wherein the conductive trace layer is conformally disposed in the recess portion and the protection layer is disposed over the conductive trace layer in the recess portion.

4. The chip package as claimed in claim 3, further comprising:
   a spacer disposed under the second surface of the semiconductor substrate; and
   a cover plate disposed under the spacer.

5. The chip device package as claimed in claim 4, wherein the protection layer and the spacer are separated by the conductive trace layer in the recess portion.

6. The chip package as claimed in claim 3, wherein the conductive trace layer in the recess portion is isolated.

7. The chip device package as claimed in claim 1, wherein the buffer plug is softer than the protection layer in the through hole.

8. The chip package as claimed in claim 1, further comprising an insulating layer disposed between the semiconductor substrate and the conductive trace layer, wherein the buffer plug has a coefficient of thermal expansion between a coefficient of thermal expansion of the protection layer and a coefficient of thermal expansion of the insulating layer.

9. The chip package as claimed in claim 1, wherein the buffer plug is not completely cured.

10. The chip device package as claimed in claim 1, wherein the buffer plug comprises one or more than one layers of photosensitive material.

11. The chip device package as claimed in claim 1, wherein the buffer plug disposed in at least two through holes have different shapes at a cross section.

12. A method for fabricating a chip package, comprising:
    providing a semiconductor substrate, having a first surface and an opposite second surface;
    forming through holes on the first surface, extending from the first surface to the second surface;
    forming a conductive trace layer on the first surface and in the through holes;
    forming a buffer plug in the through holes, wherein the buffer plug does not extend to cover above the first surface of the semiconductor substrate outside of the through hole; and
    forming a protection layer over the first surface and in the through holes.

13. The method as claimed in claim 12, further comprising:
    forming trench openings on the first surface, extending from the first surface to the second surface, wherein the trench openings are formed at a scribe line;
    forming the conductive trace layer in the trench openings;
    forming the protection layer over the conductive trace layer in the trench openings; and
    dicing the semiconductor substrate along the scribe line to form the chip packages, wherein each chip package including at least a recess portion adjacent a sidewall of the semiconductor substrate.

14. The method as claimed in claim 13, wherein the through holes and the trench openings are formed simultaneously.

15. The method as claimed in claim 13, further comprising:
    forming an insulating material, conformally covering the first surface of the semiconductor substrate and extending to sidewalls and bottom sides of the through holes and the trench openings; and
    patterning the insulating material, to remove the portions of the insulating material on the bottom sides of the through holes and the trench openings to form an insulating layer.

16. The method as claimed in claim 15, wherein the buffer plug has a coefficient of thermal expansion between a coefficient of thermal expansion of the protection layer and a coefficient of thermal expansion of the insulating layer.

17. The method as claimed in claim 13, wherein the conductive trace layer in the trench openings extends to the scribe line.

18. The method as claimed in claim 13, wherein the step of forming the buffer plug comprises:
    coating a buffer material, covering the first surface of the semiconductor substrate and filling the through holes and the trench openings;
    patterning the buffer material by an exposure and a development process to remove the buffer material in the trench openings; and
    curing the buffer material not completely to form the buffer plug.

19. The method as claimed in claim 13, wherein the buffer plug in at least two of the through holes have different shapes at a cross section.

20. The method as claimed in claim 13, wherein the buffer plug comprises one or more than one layers of photosensitive material.

21. The method as claimed in claim 13, further comprising:
    forming a spacer under the second surface of the semiconductor substrate; and
    forming a cover plate under the spacer.

22. The method as claimed in claim 21, wherein the protection layer and the spacer are separated by the conductive trace layer in the trench openings.

23. The method as claimed in claim 21, wherein the conductive trace layer in the recess portion is isolated.

24. The method as claimed in claim 12, wherein the buffer plug is formed between the conductive trace layer and the protection layer in the through holes and the buffer plug is softer than the protection layer.

* * * * *